（12) United States Patent
Chang et al.

(10) Patent No.: US 12,040,176 B2
(45) Date of Patent: Jul. 16, 2024

(54) TECHNOLOGIES FOR HIGH ASPECT RATIO CARBON ETCHING WITH INSERTED CHARGE DISSIPATION LAYER

(71) Applicant: Tokyo Electron Limited, Tokyo (JP)

(72) Inventors: Shihsheng Chang, Albany, NY (US); Andrew Metz, Albany, NY (US); Yun Han, Albany, NY (US); Minjoon Park, Albany, NY (US); Ya-Ming Chen, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 17/706,408

(22) Filed: Mar. 28, 2022

(65) Prior Publication Data

US 2023/0326737 A1 Oct. 12, 2023

(51) Int. Cl.
*H01L 21/02* (2006.01)
*H10B 43/20* (2023.01)

(52) U.S. Cl.
CPC .. *H01L 21/02115* (2013.01); *H01L 21/02172* (2013.01); *H01L 21/02488* (2013.01); *H01L 21/02592* (2013.01); *H10B 43/20* (2023.02)

(58) Field of Classification Search
CPC ........ H10B 43/20; H10B 69/00; H10B 43/27; H10B 43/35; H10B 41/27; H10B 43/10; H10B 43/30; H01L 21/02592; H01L 21/02172; H01L 21/02488; H01L 21/02115; H01L 21/311; H01L 21/0335; H01L 21/0337; H01L 29/792; H01L 21/31144; H01L 21/033; H01L 21/3065; H01L 21/76877; H01L 21/76802; H01L 29/788; H01L 21/31116; H01L 21/0332; H01L 21/768; H01L 23/5226; H01L 23/5283; H01L 29/66666; H01L 29/7827; H01L 29/513; H01L 21/31122; H01L 21/32139; H01L 29/40117
USPC ................ 438/714, 703; 257/21.218, 21.249
See application file for complete search history.

(56) References Cited

U.S. PATENT DOCUMENTS

| | | |
|---|---|---|
| 2014/0213062 A1 | 7/2014 | Shimizu et al. |
| 2019/0115251 A1 | 4/2019 | Huang |
| 2019/0123267 A1 | 4/2019 | Yang et al. |
| 2019/0172714 A1 | 6/2019 | Bobek et al. |
| 2019/0288192 A1* | 9/2019 | Takahashi .......... H10N 70/8616 |
| 2020/0020532 A1 | 1/2020 | Lin et al. |

(Continued)

OTHER PUBLICATIONS

Korean Intellectual Property Office, International Search Report and Written Opinion for International application No. PCT/US2023/016338, dated Jul. 13, 2023, 9pp.

*Primary Examiner* — Mouloucoulaye Inoussa
(74) *Attorney, Agent, or Firm* — Slater Matsil, LLP

(57) ABSTRACT

A semiconductor device structure includes a dielectric layer formed on a silicon substrate, an amorphous carbon layer (ACL) formed on the dielectric layer, and a charge dissipation layer formed between the ACL and the dielectric layer. The charge dissipation layer is formed from a material having a resistivity lower than the resistivity of the ACL. Methodologies to fabricate the semiconductor device structure are also disclosed and include forming the dielectric layer on the silicon substrate, forming the charge dissipation layer on the dielectric layer, and forming the ACL on the charge dissipation layer. Alternative semiconductor device structures and fabrication methodologies are also disclosed.

20 Claims, 15 Drawing Sheets

(56) References Cited

U.S. PATENT DOCUMENTS

2020/0365658 A1* 11/2020 Takahashi .............. H10B 63/24
2021/0026245 A1    1/2021 Lee et al.
2022/0238453 A1*  7/2022 Sharangpani .......... H10B 43/50

* cited by examiner

TECHNOLOGIES FOR HIGH ASPECT RATIO CARBON ETCHING WITH INSERTED CHARGE DISSIPATION LAYER

FIELD OF THE DISCLOSURE

The present disclosure relates to high aspect ratio semiconductor structures and methodologies for fabricating high aspect ratio semiconductor structures and, more particularly, to high aspect ratio amorphous carbon layers and associated fabrication techniques.

BACKGROUND

High aspect ratio semiconductor structures include relatively deep and narrow features that have a large ratio of depth to width. For example, certain high aspect ratio structures, such as high aspect vias, may have an aspect ratio of 50:1 or higher. These high aspect ratio features may be included in semiconductor devices such as three-dimensional (3D) NAND flash memory. Typical 3D NAND memory includes multiple layers of memory cells stacked on top of each other (e.g., 32-, 64-, or 128-layers), which dramatically increases the storage capacity of the memory device for the same 2D footprint.

Amorphous carbon layers (ACL) may be used as a hard mask material for certain materials because of its good etch selectivity to dielectrics such as the oxides or nitrides used in 3D NAND memory. However, under some conditions, high aspect ratio features etched into ACL may exhibit distortion such as twisting due to charge build-up in the ACL.

SUMMARY

According to one aspect of the disclosure, a semiconductor device structure includes a dielectric layer formed on a silicon substrate; an amorphous carbon layer formed on the dielectric layer; and a charge dissipation layer formed between the amorphous carbon layer and the dielectric layer, wherein the charge dissipation layer comprises a material having a resistivity lower than a resistivity of the amorphous carbon layer. In an embodiment, the charge dissipation layer is formed directly on the dielectric layer.

In an embodiment, the amorphous carbon layer comprises a second amorphous carbon layer, the semiconductor device structure further including a first amorphous carbon layer formed between the charge dissipation layer and the dielectric layer. In an embodiment, a second thickness of the second amorphous carbon layer is larger than a first thickness of the first amorphous carbon layer.

In an embodiment, the charge dissipation layer comprises a silicon-containing material. In an embodiment, the silicon-containing material comprises amorphous silicon, polysilicon, monocrystalline silicon, or doped silicon.

In an embodiment, the charge dissipation layer comprises a metallic material. In an embodiment, the metallic material comprises tungsten, titanium, tantalum, ruthenium, or aluminum.

In an embodiment, a portion of the charge dissipation layer is coupled to the silicon substrate at an edge of the semiconductor device structure. In an embodiment, the amorphous carbon layer has a thickness between about 2500 nanometers to about 3500 nanometers; and the charge dissipation layer has a thickness of about 50 nanometers.

In an embodiment, the dielectric layer comprises a three-dimensional NAND memory stack. In an embodiment, the three-dimensional NAND memory stack comprises alternating oxide and nitride layers.

According to another aspect, a method for manufacturing a semiconductor device includes forming a dielectric layer on a silicon substrate; forming a charge dissipation layer above the dielectric layer; and forming an amorphous carbon layer on the charge dissipation layer, wherein the charge dissipation layer comprises a material having a resistivity lower than a resistivity of the amorphous carbon layer.

In an embodiment, the method further includes forming a mask layer on the amorphous carbon layer; and etching a high-aspect ratio feature through the amorphous carbon layer, the charge dissipation layer, and the dielectric layer using the mask layer. In an embodiment, the amorphous carbon layer has a thickness between about 2500 nanometers to about 3500 nanometers before etching the high-aspect ratio feature through the amorphous carbon layer; and the charge dissipation layer has a thickness of about 50 nanometers. In an embodiment, the high-aspect ratio feature comprises a hole having a diameter of about 70 nanometers. In an embodiment, the high-aspect ratio feature comprises a slot having a width of about 150 nanometers.

In an embodiment, forming the charge dissipation layer comprises forming an electrical interface between the charge dissipation layer and a portion of the silicon substrate. In an embodiment, forming the electrical interface comprises forming a charge dissipation layer sidewall along a sidewall of the dielectric layer. Forming the amorphous carbon layer comprises forming an amorphous carbon layer sidewall overlying the charge dissipation layer sidewall that does not contact the silicon substrate.

In an embodiment, the amorphous carbon layer comprises a second amorphous carbon layer, and the method further includes forming a first amorphous carbon layer on the dielectric layer prior to forming the charge dissipation layer. Forming the charge dissipation layer above the dielectric further comprises forming the charge dissipation layer on the first amorphous carbon layer, wherein a first thickness of the first amorphous carbon layer is smaller than a second thickness of the second amorphous carbon layer.

In an embodiment, the charge dissipation layer comprises a silicon-containing material. In an embodiment, the silicon-containing material comprises amorphous silicon, polysilicon, monocrystalline silicon, or doped silicon.

In an embodiment, the charge dissipation layer comprises a metallic material. In an embodiment, the metallic material comprises tungsten, titanium, tantalum, ruthenium, or aluminum.

In an embodiment, forming the charge dissipation layer comprises coupling the charge dissipation layer to the silicon substrate at an edge of the silicon substrate. In an embodiment, the first amorphous carbon layer comprises a wall that surrounds the dielectric layer and is grounded to the silicon substrate at an electrical interface, and wherein the charge dissipation layer comprises a wall that surrounds the wall of the first amorphous carbon layer and is grounded to the silicon substrate at the electrical interface. In an embodiment, the second amorphous carbon layer does not contact the silicon substrate.

In an embodiment, the dielectric layer comprises a three-dimensional NAND memory stack. In an embodiment, the three-dimensional NAND memory stack comprises alternating oxide and nitride layers.

According to another aspect, a semiconductor device structure includes a silicon substrate comprising a first surface that extends to a wafer edge; a dielectric layer formed on the first surface of the silicon substrate; and a charge dissipation layer formed on the dielectric layer. The charge dissipation layer comprises a wall that surrounds the dielectric layer, wherein the wall is coupled to the silicon substrate between the wafer edge and the dielectric layer, and wherein the charge dissipation layer has a thickness of about 50 nanometers. The semiconductor device structure further includes an amorphous carbon layer formed on the charge dissipation layer. The amorphous carbon layer has a thickness between about 2500 nanometers and 3500 nanometers, and the charge dissipation layer comprises a material having a resistivity lower than a resistivity of the amorphous carbon layer.

In an embodiment, the amorphous carbon layer comprises a second amorphous carbon layer, and the semiconductor device further includes a first amorphous carbon layer formed between the charge dissipation layer and the dielectric layer. The first amorphous carbon layer has a thickness that is less than the thickness of the second amorphous carbon layer.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
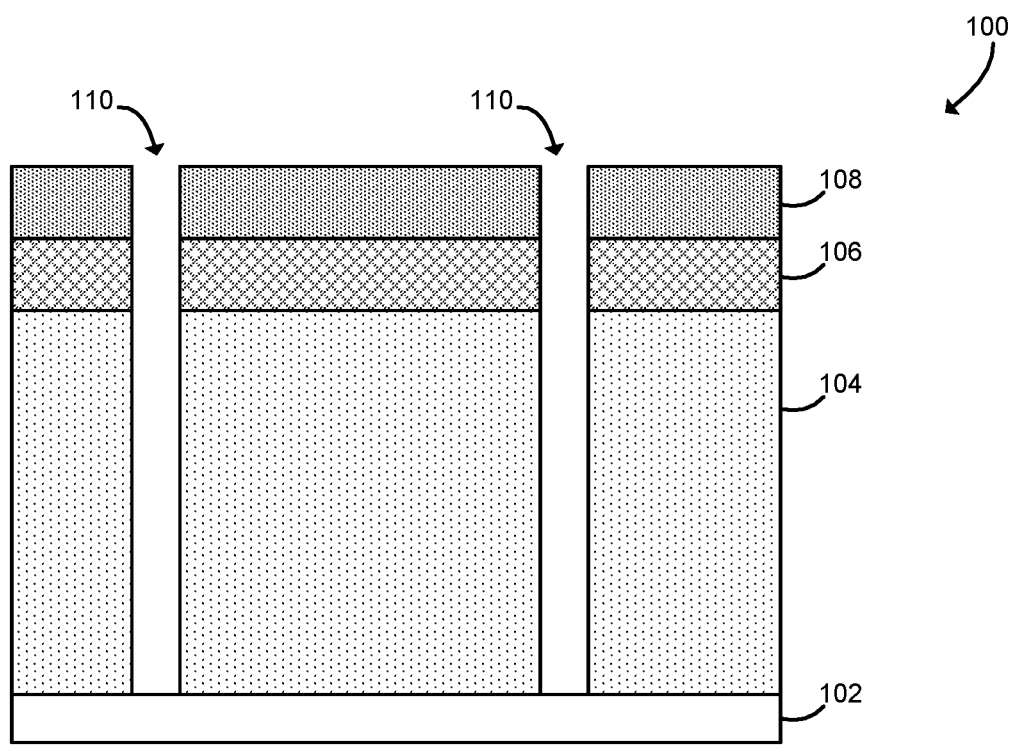
FIG. 1 is a cross-sectional, elevation view of at least one embodiment of a semiconductor device including a charge dissipation layer positioned below an amorphous carbon layer (ACL)

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 20:
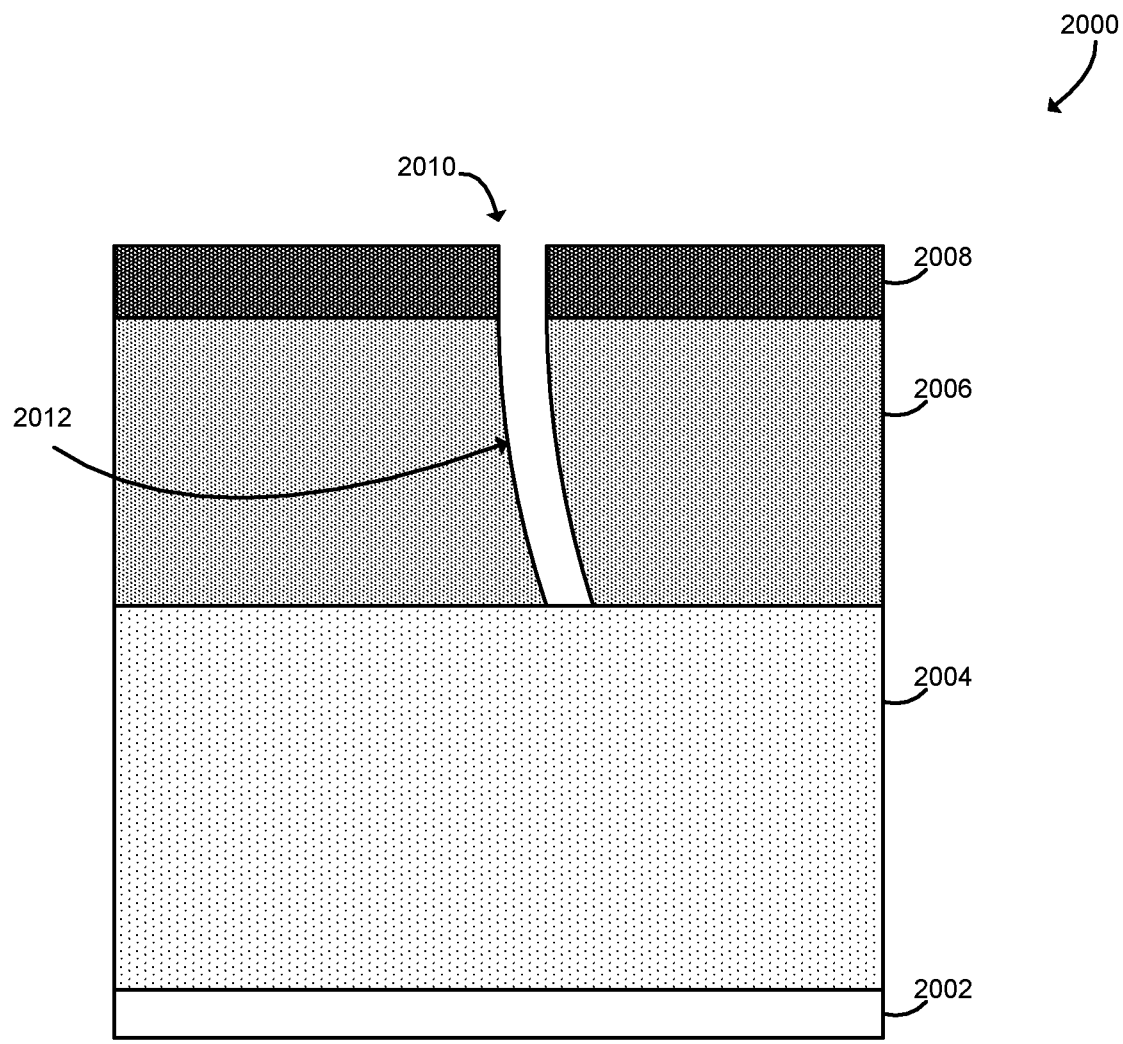
FIG. 20 is a cross-sectional, elevation view of a typical semiconductor device subsequent to etching an ACL hard mask.

Referring initially to FIG. 20 and as discussed above, an amorphous carbon layer (ACL) may be used as a hard mask material for etching certain semiconductor devices. For example, as shown in FIG. 20, a typical semiconductor device includes a dielectric 2004 formed on a substrate 2002, an ACL hard mask 2006 formed on the dielectric 2004, and a mask layer 2008 formed on the ACL 2006. The dielectric 2004 may be a monolithic layer such as an oxide or multiple layers of dielectrics such as oxides and nitrides included in a NAND memory array stack. The mask layer 2008 may include photoresist and other typical mask materials. As shown, a feature 2010 is formed in the mask layer 2008, and that feature has been etched into the ACL 2006. However, as shown in FIG. 20, the etched feature 2010 is distorted within the ACL 2006. In particular, the feature 2010 is twisted, meaning that an inner wall 2012 of the feature 2010 is bent away from vertical. In a typical hard ACL 2006, twisting may start at about 1.5 μm of depth. In certain situations, twisting may be reduced by increasing energy of ionization of the plasma used for etching by applying a pulsed bias. However, increasing energy of ionization in order to reduce twisting may increase other types of distortion, such as bowing. Accordingly, typical semiconductor fabrication processes may require making tradeoffs between various types of distortion.

Referring now to FIG. 1, a semiconductor device 100 fabricated according to the techniques disclosed herein is shown. The semiconductor device 100 includes a dielectric 104 formed on a silicon substrate 102. A charge dissipation layer 106 is formed on the dielectric 104, and an amorphous carbon layer (ACL) 108 is formed on the charge dissipation layer 106. Multiple high aspect ratio features 110 are defined through the ACL 108, the charge dissipation layer 106, and the dielectric 104. The high aspect ratio features 110 may be embodied as holes, trenches, slits, or other features having a relatively large ratio of depth to width. As described further below, the high aspect ratio features 110 of the semiconductor device 100 may include reduced distortion (e.g., straighter sides) as compared to high aspect ratio features formed in typical semiconductor devices such as the device 2000. Additionally, because the device structure 100 includes an ACL 108 over a dielectric 104 similar to the device structure 2000, the device structure 100 may be compatible with similar processes and usable for manufacturing similar devices as a typical device structure 2000.

The silicon substrate 102 may be embodied as any type of silicon substrate on which the dielectric layer 104 and other semiconductor device components can be formed. The dielectric 104 may be embodied as a monolithic dielectric component such as an oxide, or as a stack of components such as alternating oxide and nitride layers. For example, in some embodiments, the dielectric layer 104 may be embodied as an oxide-nitride-oxide-nitride (ONON) stack used to produce a three-dimensional NAND flash memory device. The dielectric layer 104 may have a thickness of, for example, between about 6 to 12 microns. As another example, in some embodiments the dielectric layer 104 may have a thickness of about 45 microns. It should be appreciated that the illustrated architecture of the semiconductor device 100 of FIG. 1 is a simplified, abstracted illustration of the associated device and may include additional or different architectures, layers, devices, portions, and/or structures, which are not shown in the associated figures for clarity of the drawings, in other embodiments depending on the type and complexity of the device 100.

The ACL 108 may be embodied as a layer of relatively hard amorphous carbon that may function as a hard mask for the device 100, as described further below. For example, the ACL 108 may be an amorphous carbon-hydrogen alloy having a relatively high density, for example from about 1.6-2.2 g/cm$^3$, and a relatively high hardness, for example from about 10-20 GPa. Illustratively, the ACL 108 may be embodied as an Advanced Patterning Film (APF), commercially available from Applied Materials, Inc. of Santa Clara, California.

The charge dissipation layer 106 may be embodied as a material layer having a resistivity lower than the resistivity of the ACL 108. In some embodiments, the charge dissipation layer 106 may be embodied as a silicon-containing material, such as amorphous silicon (a-Si), polysilicon (p-Si), or monocrystalline silicon. Additionally, in some embodiments, the silicon-containing material may be doped with one or more other elements to reduce resistivity. Further, in some embodiments, the charge dissipation layer 106 may be embodied as a metallic material, such as aluminum, titanium, tungsten, tantalum, and/or or ruthenium. In some embodiments, the charge dissipation layer 106 may be embodied as tungsten silicide (WSi) or another relatively conductive ceramic material.

As shown in FIG. 1, the device 100 includes multiple high aspect ratio (HAR) features 110. Each of the features has a relatively high ratio of depth to width or other opening size. For example, in some embodiments, each of the features 110 may be a contact hole having a diameter of about 50-80 nanometers or a slot having a width of about 150 nanometers. As described above, in an illustrative embodiment, the dielectric layer 104 has a thickness of between 6 to 12 microns (i.e., 6,000 to 12,000 nm). Accordingly, in those embodiments, the features 110 may have an aspect ratio of about 75:1 to 150:1. The HAR features 110 may be used, for example, to form individual memory cell transistors for 3D NAND memory devices, gates, vias, or other semiconductor device features.

Additionally, it should be appreciated that, while various layers of the device structure 100 have been described as being formed "on" another layer of the device structure 100, such layers of the device structure 100 (and other device structures described herein) may be formed directly on top of the other layer or may have one or more other intervening layers between the two described layers (e.g., insulator layers). For example, while the charge dissipation layer 106 has been described as being formed on the dielectric layer 104, the semiconductor device structure 100 may include one or more layers (e.g., mask layers or insulator layers) between the corresponding charge dissipation and dielectric layers.

Figure 2:
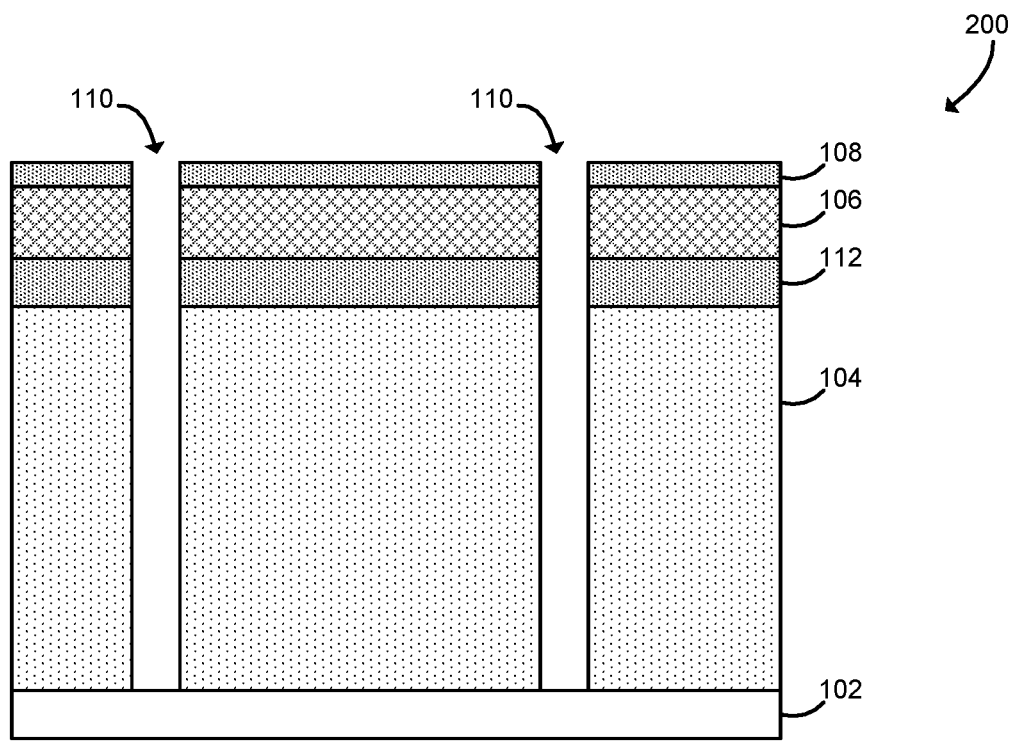
FIG. 2 is a cross-sectional, elevation view of another embodiment of a semiconductor device including a charge dissipation layer positioned within an amorphous carbon layer (ACL) toward the bottom of the ACL.

Referring now to FIG. 2, another embodiment of a semiconductor device 200 is shown. The illustrative semiconductor device 200 includes the silicon substrate 102, the dielectric 104, and another ACL 112 formed on the dielectric layer 104. The charge dissipation layer 106 is formed on the ACL 112, and the ACL 108 is formed on the charge dissipation layer 106. The combined thickness of the ACL 108, the charge dissipation layer 106, and the ACL 112 is similar to the combined thickness of the ACL 108 and the charge dissipation layer 106 illustrated in FIG. 1. As described further below, similar to the device 100 shown in FIG. 1, the device 200 may include high aspect ratio features 110 with reduced distortion as compared to typical devices.

Figure 3:
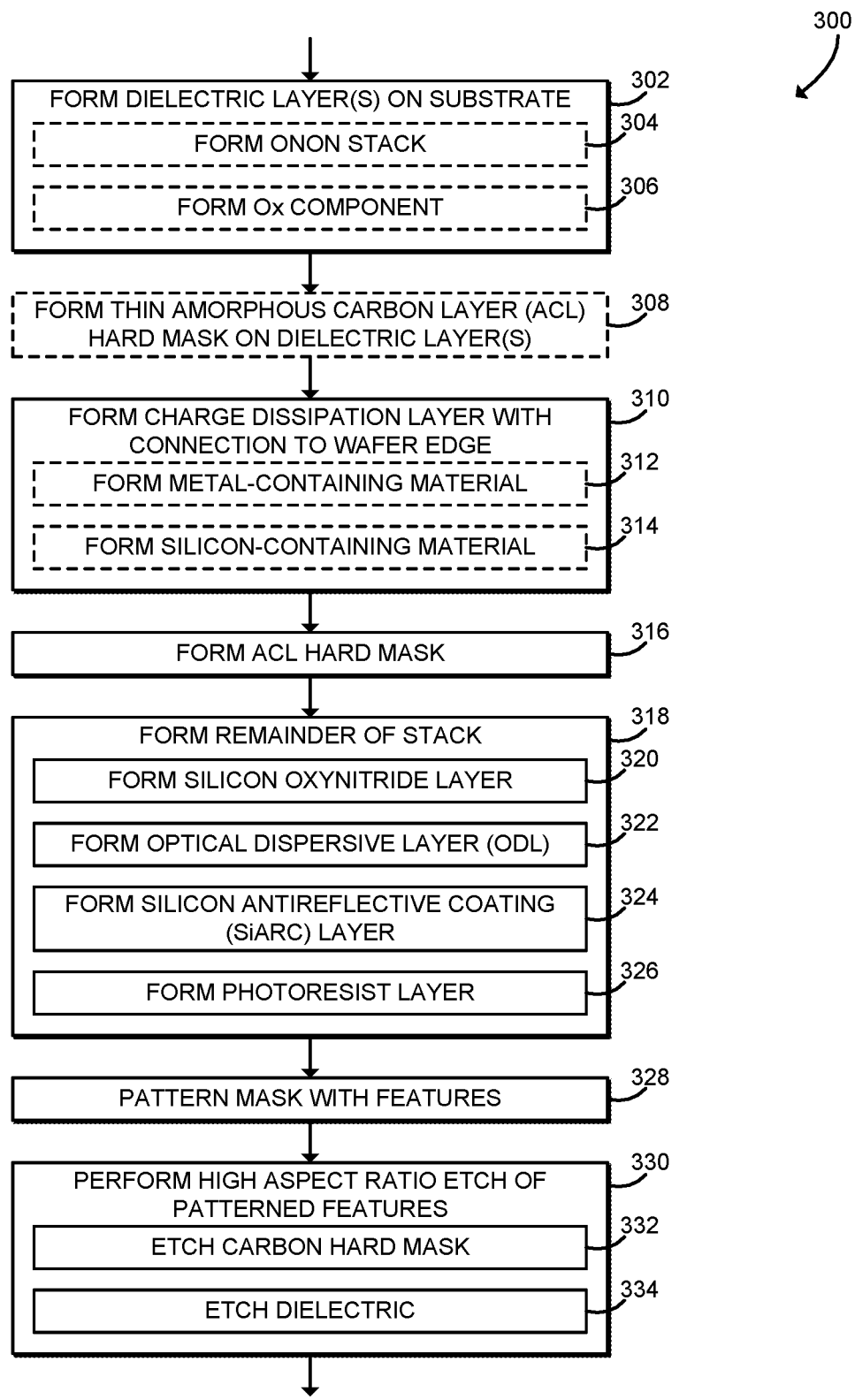
FIG. 3 is a simplified flow chart of at least one embodiment of a method for fabricating the semiconductor device of FIGS. 1 and 2.
Figure 4:
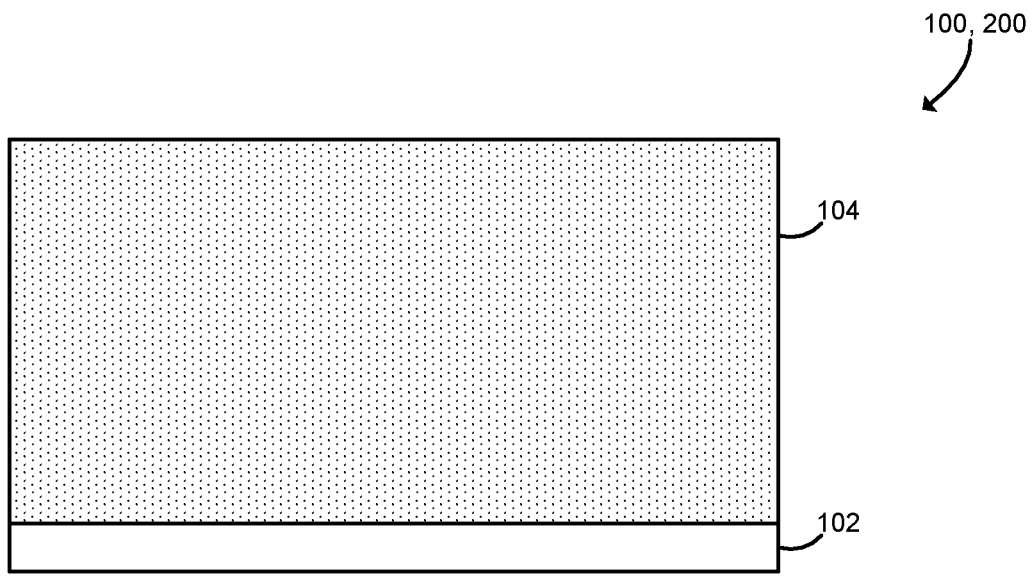
FIG. 4 is a cross-sectional, elevation view of at least one embodiment of semiconductor device formed during the performance of the method of FIG. 3 and having a dielectric formed on a substrate.

Referring now to FIG. 3, in some embodiments, a method 300 may be performed to fabricate the silicon device structure 100, 200. It should be appreciated that not every fabrication step may be described below, and that one of ordinary skill in the art would understand that additional, related and non-related steps (e.g., various cleaning steps) may be performed throughout the method 300. The method 300 begins with block 202 in which the dielectric layer 104 is formed on the silicon substrate 102 as shown in FIG. 4. It should be appreciated that at this stage of the method 300, the silicon substrate 102 may have a substantially greater thickness than at later stages of the method 300 to provide physical support for the device 100, 200.

Referring back to block 302 of FIG. 3, any suitable fabrication process may be used to form the dielectric layer 104. For example, in some embodiments in block 304, the dielectric layer 104 may be formed as an ONON patterned stack. In those embodiments, the dielectric layer 104 may be formed by depositing alternating layers of conductive and insulating layers, such as silicon oxide and silicon nitride, on the silicon substrate 102 (e.g., to form a "ONON" patterned stack). The layers of silicon oxide and silicon nitride may be formed on the silicon substrate 102 using any suitable deposition, growth, or formation technique such as a chemical vapor deposition (CVD) or plasma-enhanced chemical vapor deposition (PECVD) technique. Additionally or alternatively, in other embodiments, the dielectric layer 104 may be formed by depositing alternating layers of silicon oxide and polysilicon on the silicon substrate 102 (e.g., to form a "OPOP" patterned stack). In some embodiments, in block 306, the dielectric layer 104 may be formed as a monolithic oxide component, such as a monolithic layer of silicon oxide.

Figure 12:
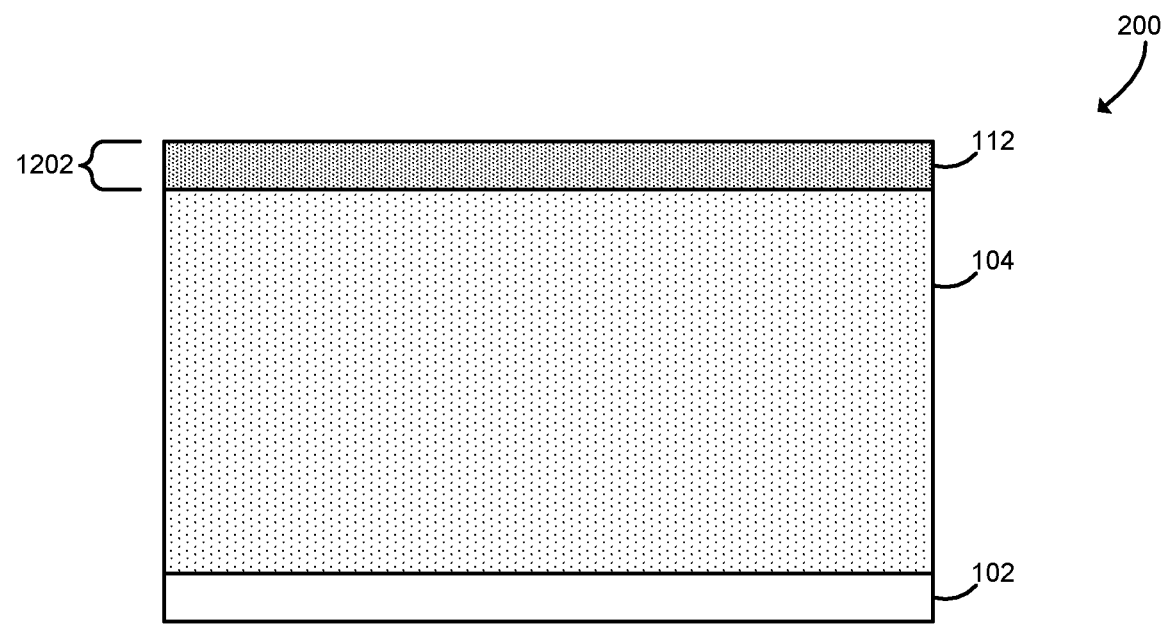
FIG. 12 is a cross-sectional, elevation view of another embodiment of the semiconductor device of FIG. 4 subsequent to the formation of an ACL hard mask on the dielectric during the performance of the method of FIG. 3.

After the initial dielectric layer 104 has been formed in block 302, in some embodiments the method 300 may advance to block 308, in which a relatively thin amorphous carbon layer (ACL) 112 is formed on the dielectric layer 104 as shown in FIG. 12. The ACL 112 has a thickness 1202, which as described further below is relatively thin compared to a corresponding thickness of the ACL 108 formed on the charge dissipation layer 106.

Figure 5:
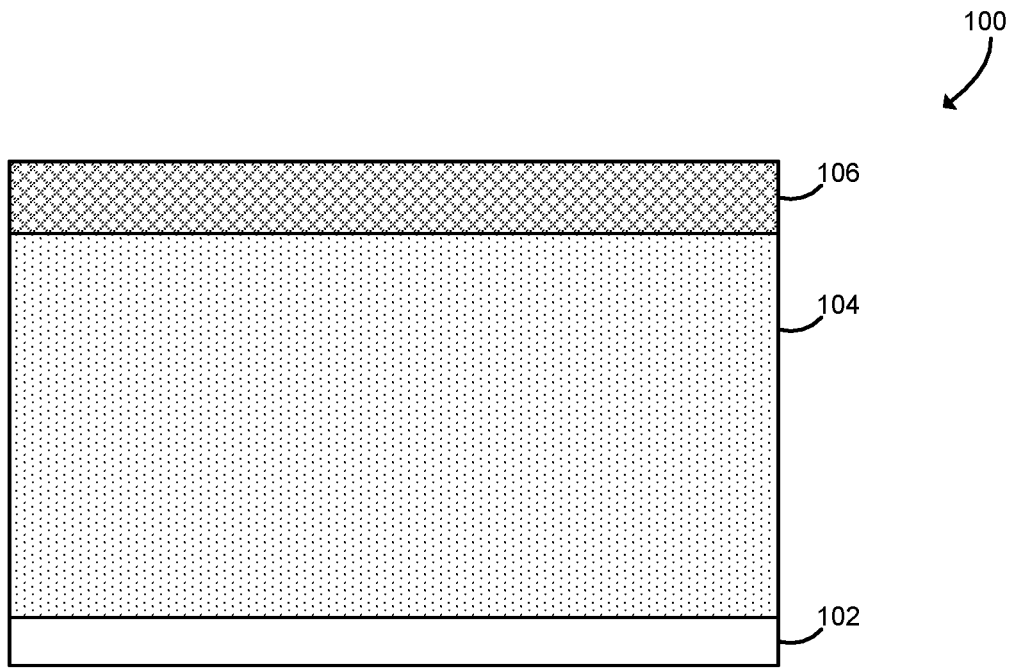
FIG. 5 is a cross-sectional, elevation view of at least one embodiment of the semiconductor device of FIG. 4 subsequent to the formation of a charge dissipation layer on the dielectric during the performance of the method of FIG. 3.
Figure 13:
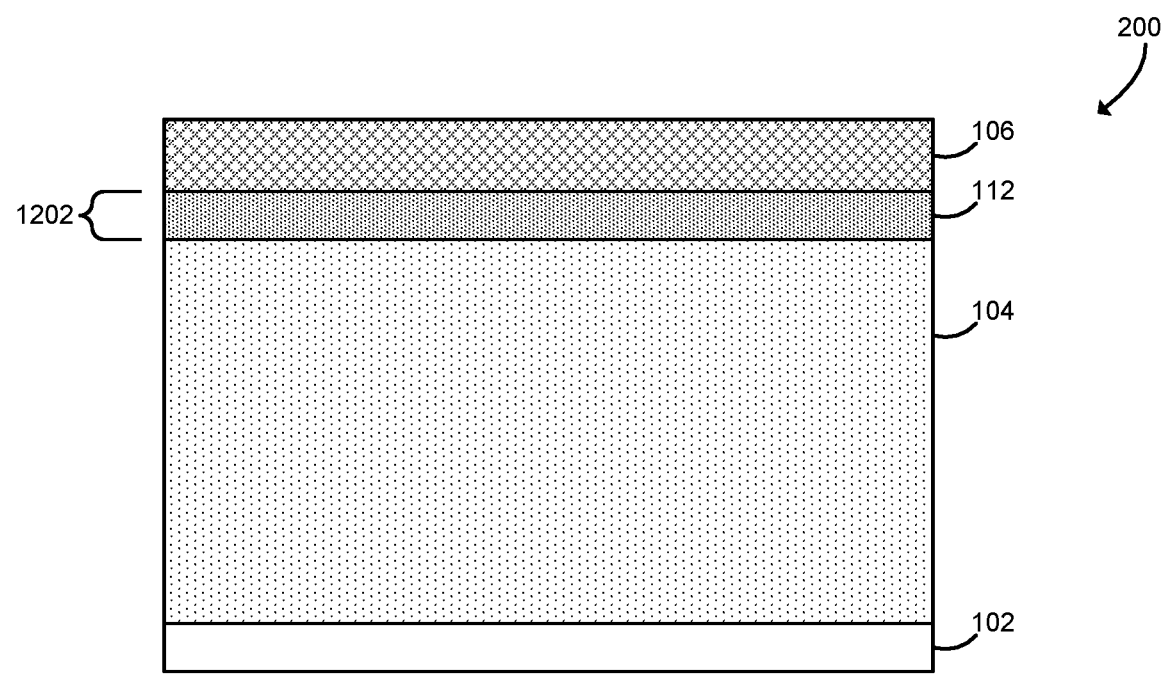
FIG. 13 is a cross-sectional, elevation view of at least one embodiment of the semiconductor device of FIG. 12 subsequent to the formation of a charge dissipation layer on the ACL during the performance of the method of FIG. 3.

Referring back to FIG. 3, after forming the dielectric layer 104 and, in some embodiments, after forming the ACL 112, the method 300 proceeds to block 310, in which the charge dissipation layer 106 is formed. For example, as shown in FIG. 5, in some embodiments the charge dissipation layer 106 may be formed directly on the dielectric layer 104 of the device 100. As another example, as shown in FIG. 13, in some embodiments the charge dissipation layer 106 may be formed directly on the ACL 112 of the device 200. The charge dissipation layer 106 is relatively thin compared to the dielectric layer 104. For example, in some embodiments, the charge dissipation layer 106 may have a thickness of about 50 nanometers. In other embodiments, the charge dissipation layer 106 may have a thickness of up to a few microns (e.g., less than 3 microns). The charge dissipation layer 106 is configured to be capable of conducting electrical charge away from the ACL 108.

As described above, the charge dissipation layer 106 may be formed from a material having a lower resistivity than the ACL 108. The charge dissipation layer 106 may be formed using any suitable deposition, growth, sputtering, or formation technique such as a chemical vapor deposition (CVD) or plasma-enhanced chemical vapor deposition (PECVD) technique. In some embodiments, in block 312, the charge dissipation layer 106 may be formed from a metal-containing material, such as a material including aluminum, titanium, tungsten, tantalum, and/or or ruthenium. In some embodiments, in block 314 the charge dissipation layer 106 may be formed from a silicon-containing material such as amorphous silicon, polysilicon, monocrystalline silicon, or doped silicon.

Figure 6:
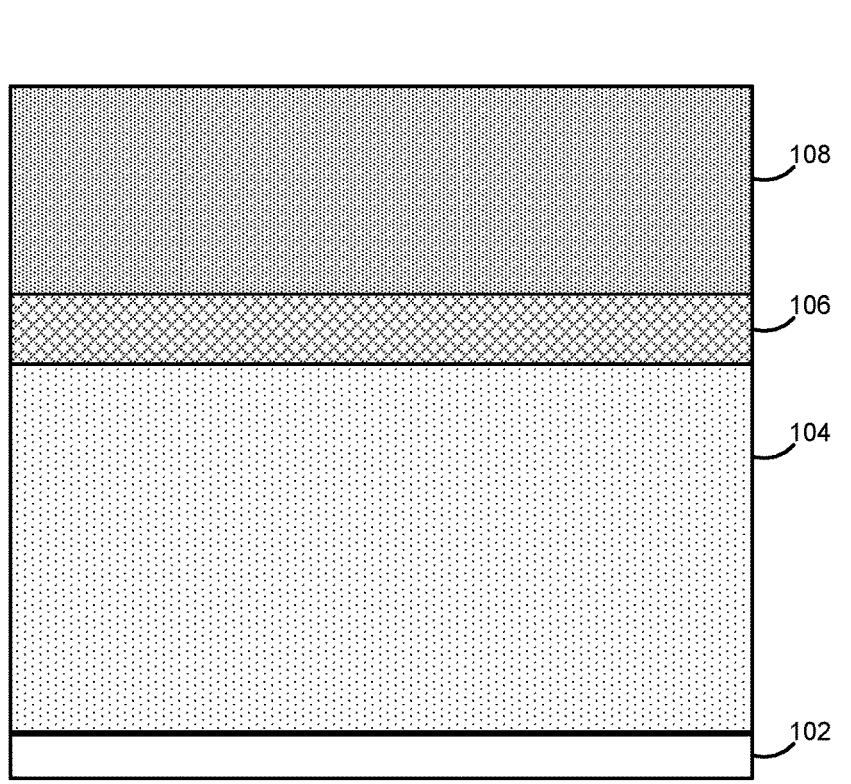
FIG. 6 is a cross-sectional, elevation view of at least one embodiment of the semiconductor device of FIG. 5 subsequent to the formation of an ACL hard mask on the charge dissipation layer during the performance of the method of FIG. 3.
Figure 14:
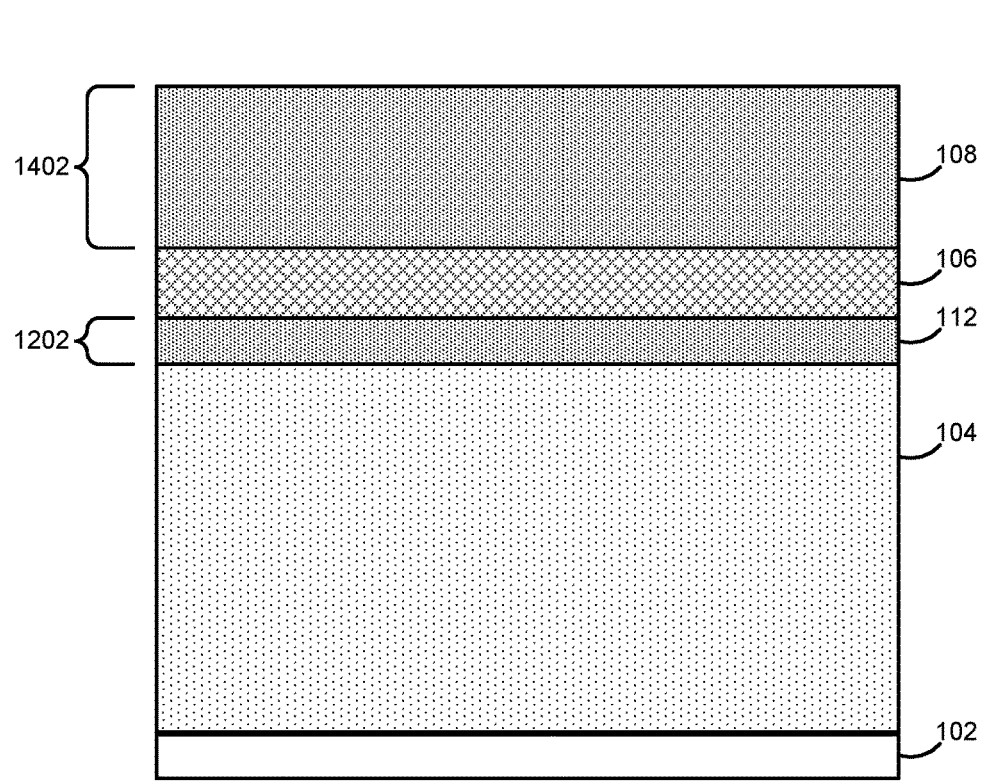
FIG. 14 is a cross-sectional, elevation view of at least one embodiment of the semiconductor device of FIG. 13 subsequent to the formation of an ACL hard mask on the charge dissipation layer during the performance of the method of FIG. 3.

Referring again to FIG. 3, after forming the charge dissipation layer 106, in block 316 the ACL 108 hard mask layer is formed. As described above, the ACL 108 is formed from a hard amorphous carbon material. The material of the ACL 108 has good etch selectivity for the dielectric layer 104. After formation, the ACL 108 may have a thickness of a few microns. In an embodiment, the ACL 108 may have a thickness between about 2.5 microns to 3.5 microns (i.e., about 2500 nm to 3500 nm). Accordingly, after formation, the charge dissipation layer 106 is positioned toward the bottom of the ACL 108; that is, closer to the dielectric layer 104 than to the top surface of the ACL 108. For example, as shown in FIG. 6, in some embodiments the ACL 108 is formed directly on the charge dissipation layer 106 of the device 100. As another example, as shown in FIG. 14, in some embodiments the ACL 108 is formed on the charge dissipation layer 106, which is formed on the ACL 112 of the device 200. In those embodiments, the first ACL 112 may be formed on the dielectric layer 104, the charge dissipation layer 106 may be formed on the first ACL 112, and the second ACL 108 may be formed on the charge dissipation layer 106. As shown in FIG. 14, the ACL 108 has a thickness 1402, which is larger than the thickness 1202 of the ACL 112. For example, the thickness 1402 may be between about 2500 nm to 3500 nm, and the thickness 1202 may be a much smaller (e.g., a few hundred nm). Accordingly, the charge dissipation layer 106 of the device 200 is also positioned toward the bottom of the ACL 108, 112. As described above, in some embodiments, the combined thickness of the ACL 108 and the charge dissipation layer 106 of the device 100 may be the same or roughly the same as the combined thickness of the ACL 108, the charge dissipation layer 106, and the ACL 112 of the device 200. Additionally or alternatively, although illustrated in FIGS. 6 and 14 as including a single charge dissipation layer 106, it should be understood that in some embodiments a similar device may include multiple charge dissipation layers 106 that are separated by additional ACLs 112.

Figure 7:
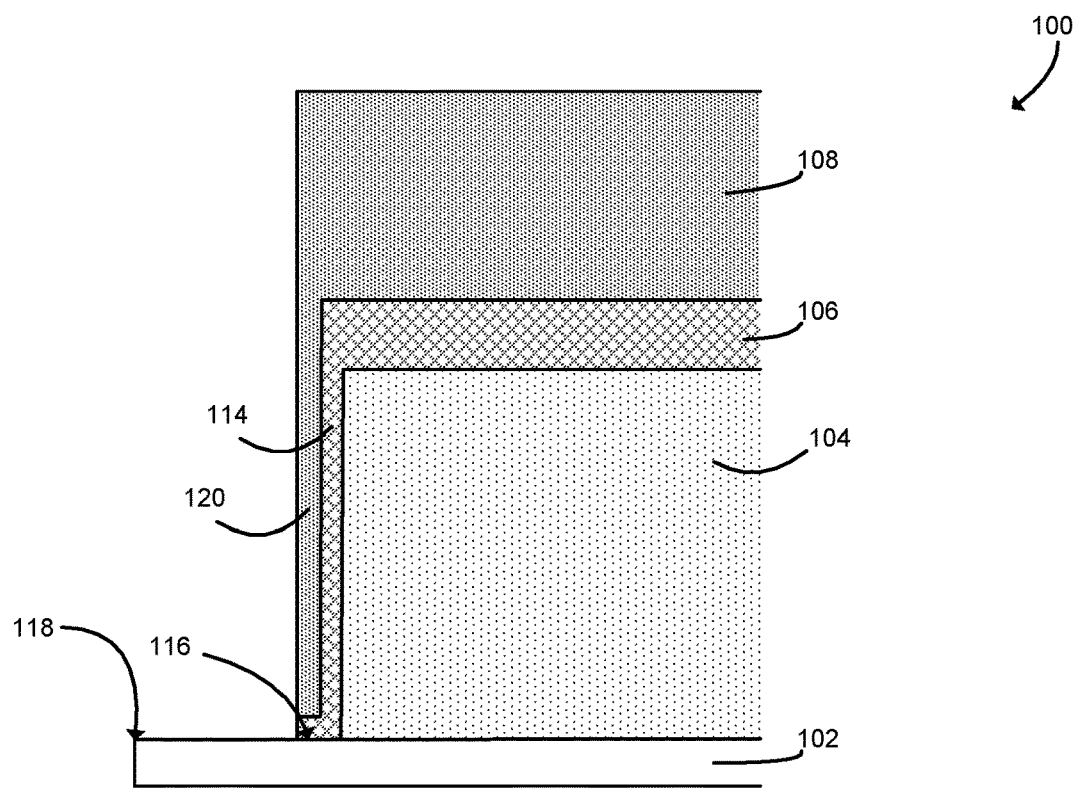
FIG. 7 is a cross-sectional, elevation detail view of at least one embodiment of the semiconductor device of FIG. 6.

As described above, the charge dissipation layer 106 may be coupled to the silicon substrate 102 at a wafer edge or otherwise grounded in order to provide a destination for electrical charge. For example, a detail view of a wafer edge of the device 100 is shown in FIG. 7. As shown in FIG. 7, the charge dissipation layer 106 includes a sidewall 114 that surrounds the dielectric layer 104. The sidewall 114 contacts the silicon substrate 102 at an electrical interface 116. As shown, the interface 116 is positioned between the dielectric layer 104 and a wafer edge 118 of the silicon substrate 102. Similarly, the ACL 108 includes a sidewall 120 that surrounds the sidewall 114 of the charge dissipation layer 106. Illustratively, the ACL 108 overlays the charge dissipation layer 106 but does not contact the silicon substrate 102.

Figure 15:
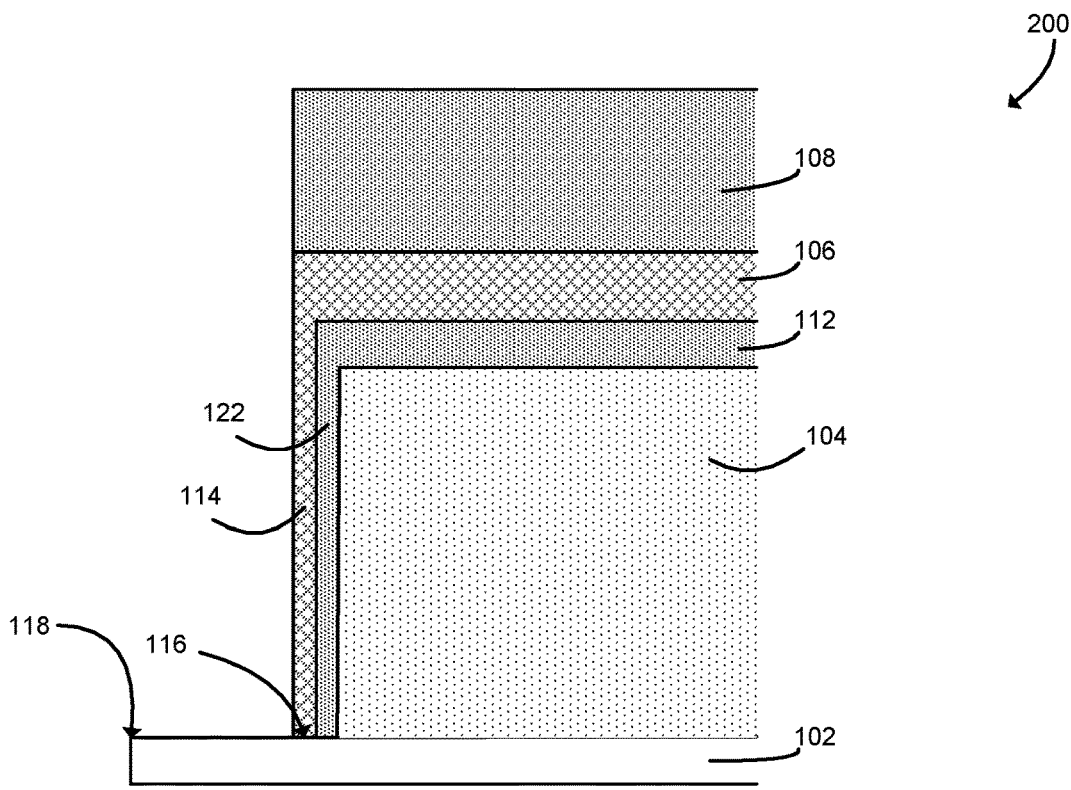
FIG. 15 is a cross-sectional, elevation detail view of at least one embodiment of the semiconductor device of FIG. 14.

As another example, a detail view of a wafer edge of the device 200 is shown in FIG. 15. The illustratively ACL 112 includes a sidewall 122 that surrounds the dielectric layer 104. The charge dissipation layer 106 includes the sidewall 114 that surrounds the sidewall 122 of the ACL 112 as well as the dielectric layer 104. The sidewall 114 of the charge dissipation layer 106 also contacts the silicon substrate 102 at the electrical interface 116, between the wafer edge 118 and the dielectric layer 104. As shown in FIG. 15, the illustrative ACL 108 overlays the charge dissipation layer 106 but does not contact the silicon substrate 102.

Figure 8:
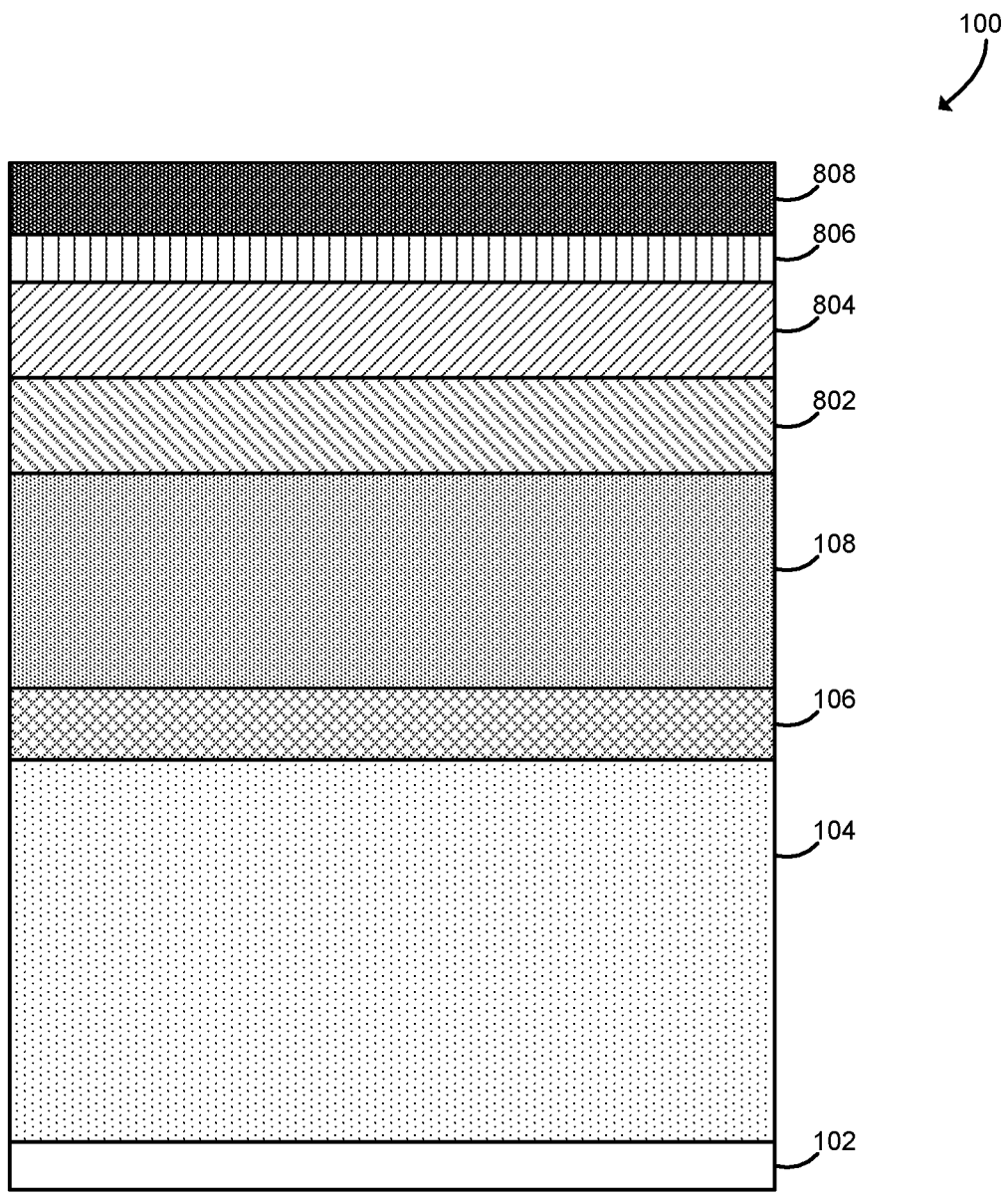
FIG. 8 is a cross-sectional, elevation view of at least one embodiment of the semiconductor device of FIG. 6 subsequent to forming a mask layer during the performance of the method of FIG. 3.
Figure 16:
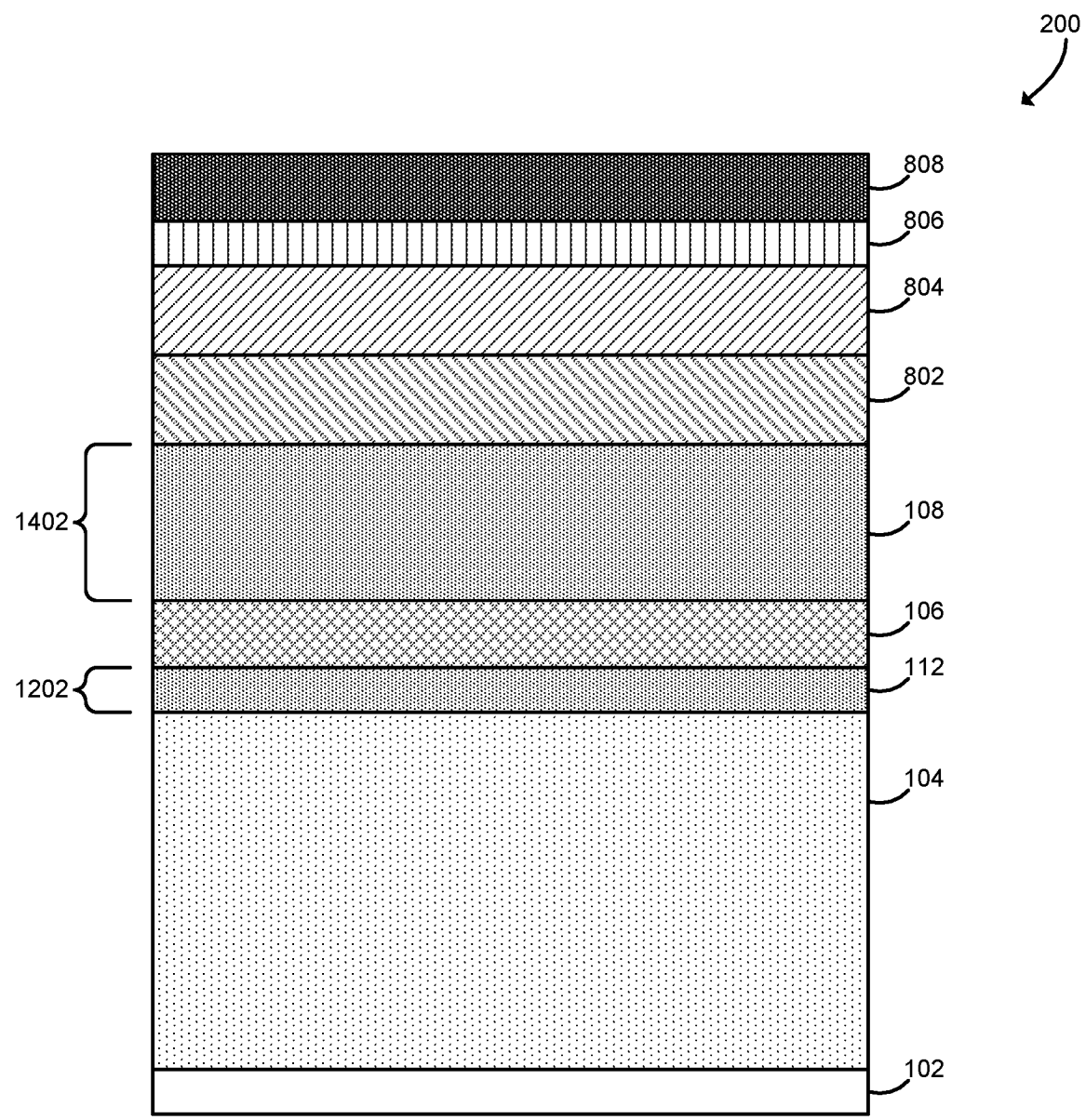
FIG. 16 is a cross-sectional, elevation view of at least one embodiment of the semiconductor device of FIG. 14 subsequent to forming a mask layer during the performance of the method of FIG. 3.

Referring back to FIG. 3, after forming the ACL 108, in block 318 the remainder of a device stack is formed. The remainder of the stack may include, for example, one or more mask layers or other patterning features for photolithography. For example, a full stack of the device 100 is shown in FIG. 8, and a full stack of the device 200 is shown in FIG. 16. In block 320, a silicon oxynitride (SiON) layer 802 is formed. The SiON layer 802 may have a thickness between about 135 nanometers to 400 nanometers. In the illustrative embodiment, the SiON layer 802 has a thickness of 300 nanometers. In block 322, an optical dispersive layer (ODL) 804 may be formed. The ODL 804 may be formed from a soft carbon material, and may have a thickness from about 200 nanometers to about 400 nanometers. In the illustrative embodiment, the ODL 804 has a thickness of 400 nanometers. In block 324, a silicon anti-reflective coating (SiARC) layer 806 may be formed. The SiARC layer 806 may have a thickness of about 30 nanometers to 35 nanometers. In block 326, a photoresist (PR) layer 808 may be formed. The PR layer 808 may have a thickness of about 15 to 80 nanometers. In the illustrative embodiment, the PR layer 808 has a thickness of 50 nanometers.

Figure 9:
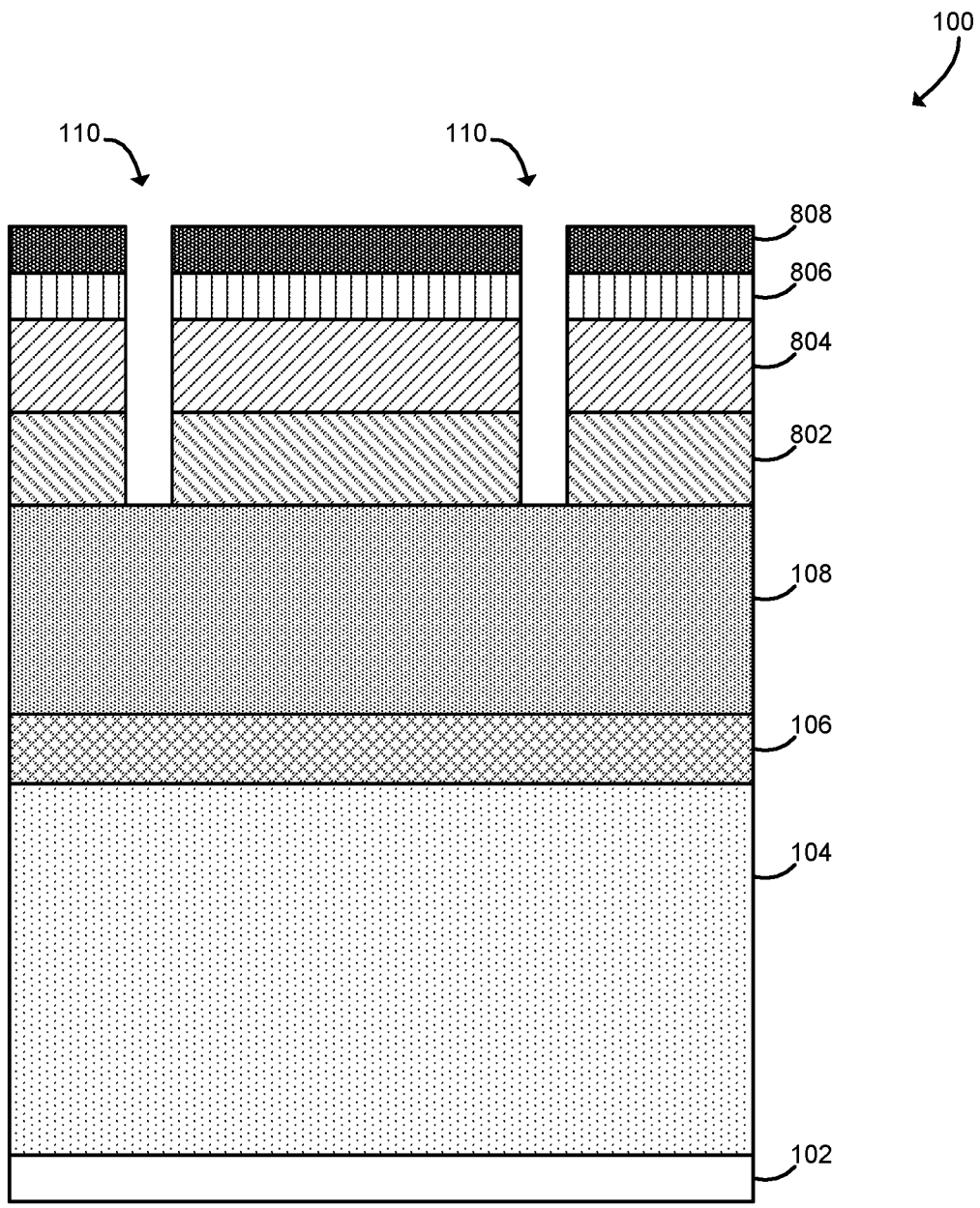
FIG. 9 is a cross-sectional, elevation view of at least one embodiment of the semiconductor device of FIG. 8 subsequent to etching the mask layer during the performance of the method of FIG. 3.
Figure 17:
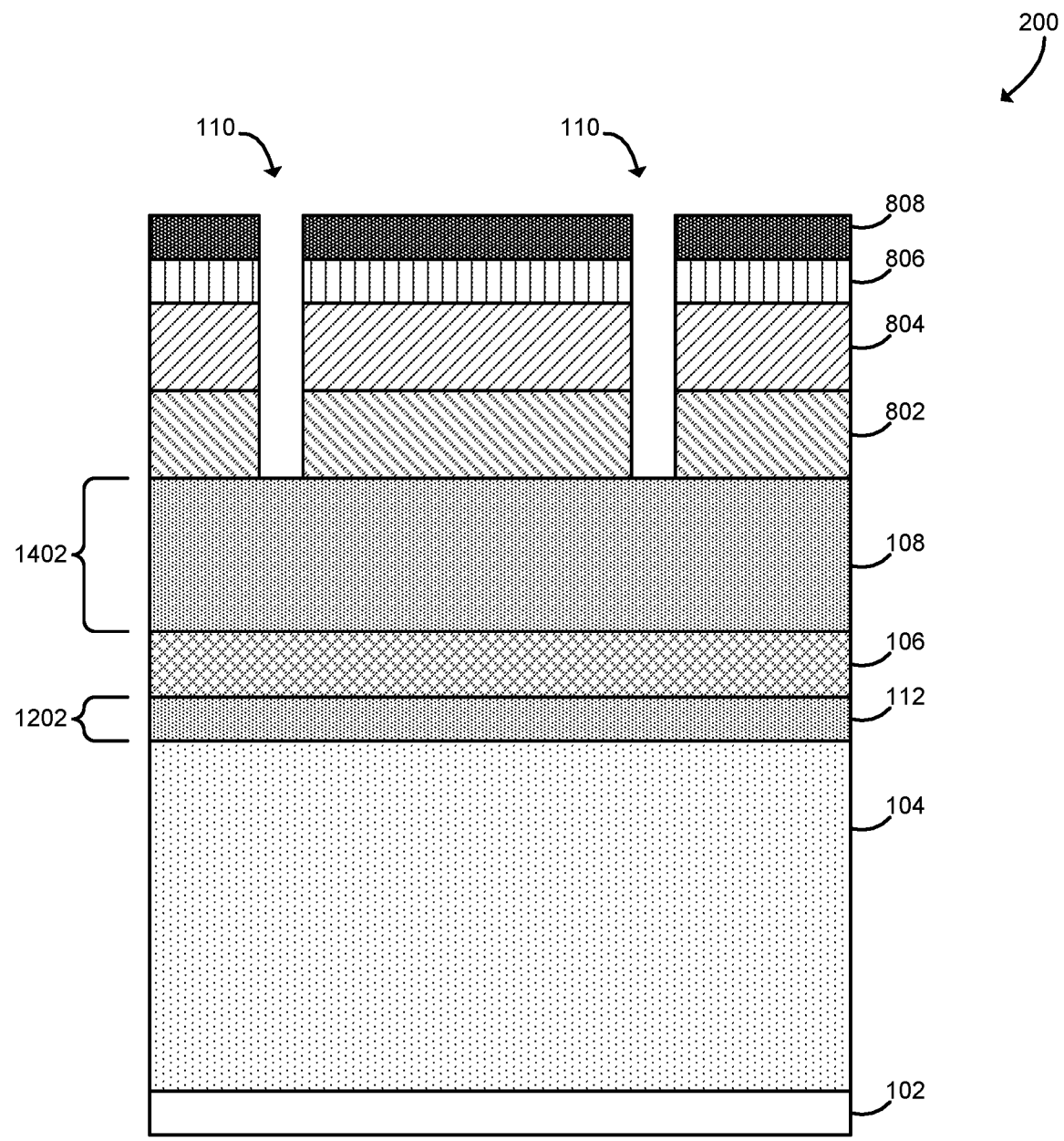
FIG. 17 is a cross-sectional, elevation view of at least one embodiment of the semiconductor device of FIG. 16 subsequent to etching the mask layer during the performance of the method of FIG. 3.

In block 328, the mask layer is patterned with one or more features 110. As described above, the features 110 may be embodied as high aspect ratio features such as holes or slots. After patterning, portions of the ACL 108 positioned within the features 110 are exposed for etching. For example, as shown in FIGS. 9 and 17, after patterning, the features 110 are defined through the PR layer 808, the SiARC layer 806, the ODL 804, and the SiON layer 802.

Figure 10:
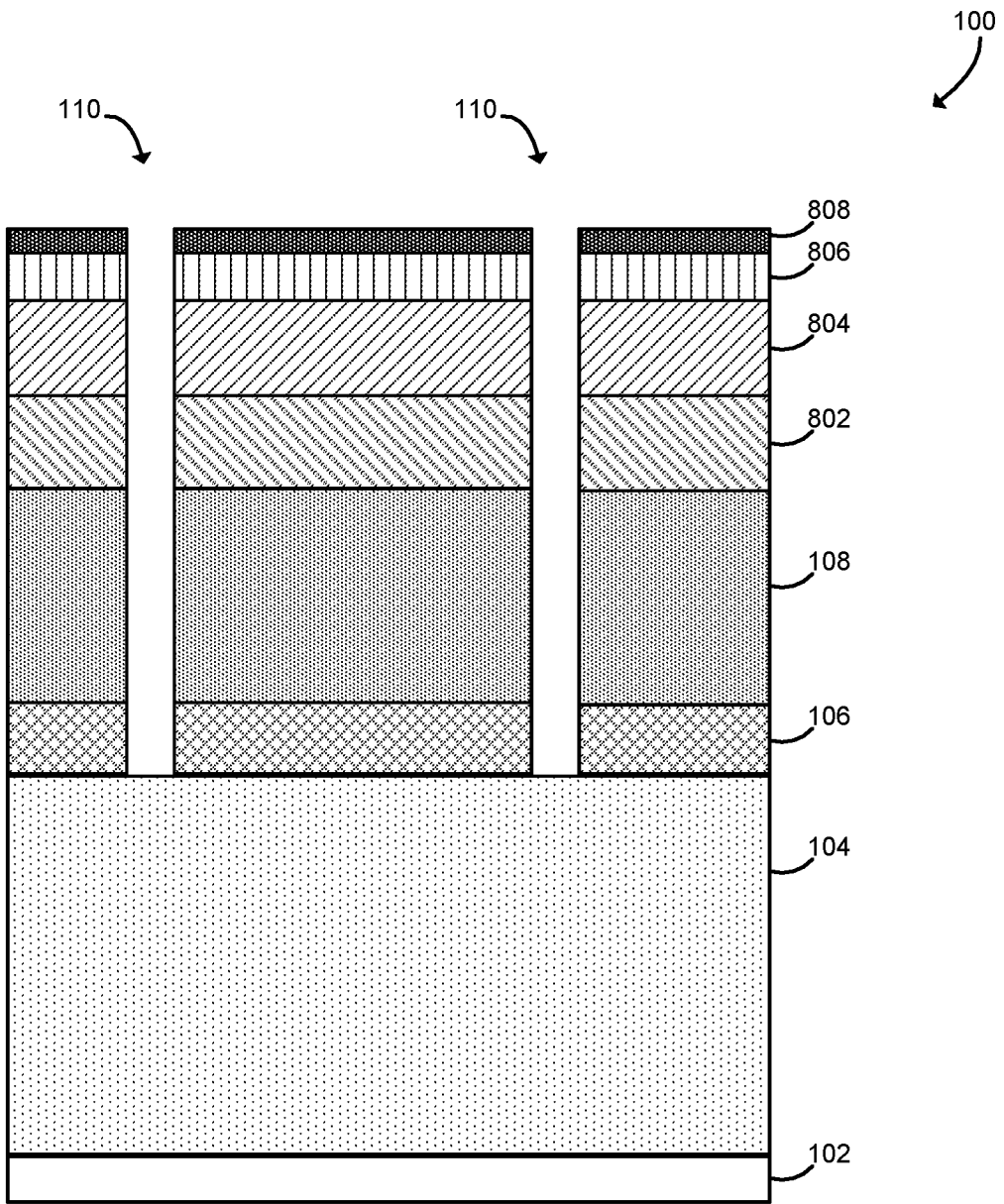
FIG. 10 is a cross-sectional, elevation view of at least one embodiment of the semiconductor device of FIG. 9 subsequent to etching the ACL during the performance of the method of FIG. 3.
Figure 18:
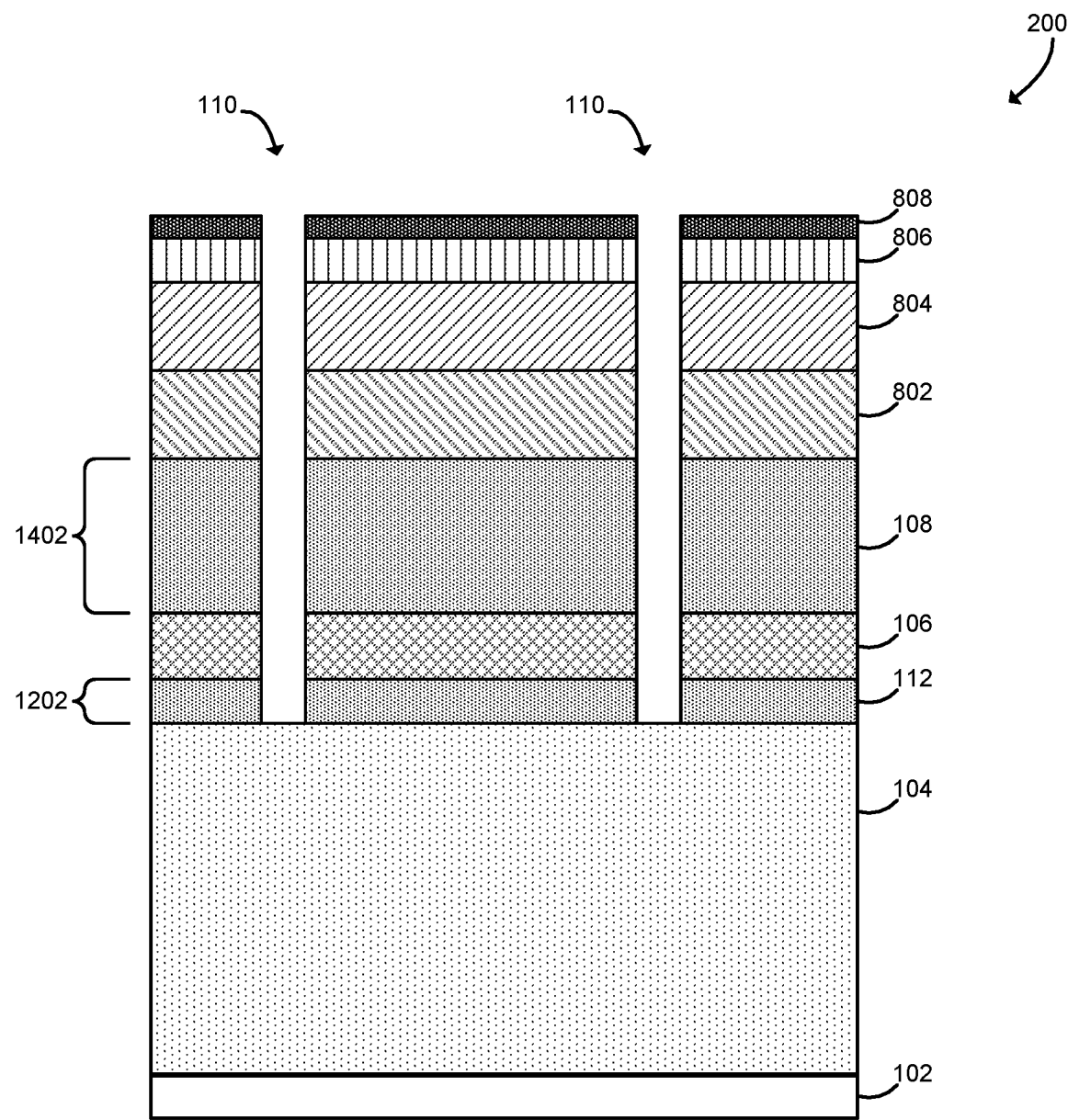
FIG. 18 is a cross-sectional, elevation view of at least one embodiment of the semiconductor device of FIG. 17 subsequent to etching the ACL during the performance of the method of FIG. 3.

Referring back to FIG. 3, after patterning the mask, in block 330 a high aspect ratio etch of the patterned features 110 is performed. The features 110 may be etched, for example, by plasma etching the device 100, 200 in an inductively coupled plasma (ICP) chamber. In block 332, a carbon etch of the ACL hard mask is performed. For example, the carbon etch may be performed using carbon etch chemistry containing oxygen and sulfur (e.g., $O_2$, $SO_2$, or COS). Etching the hard mask may remove the parts of the ACL 108, the charge dissipation layer 106, and (if present) the ACL 112 that are revealed within the features 110. Depending on material bonding energy, ion energy, and chemistry, in some embodiments the charge dissipation layer 106 may not be opened during the carbon etch. In those embodiments, removing the charge dissipation layer 106 may require an additional etch step with etch chemistry containing CF species or halogen species. Additionally or alternatively, in some embodiments, an additive such as CF or halogen may be added at certain stages of the carbon etch to open the charge dissipation layer. During the etch, excess electrical charge transferred by ions associated with the plasma etching process to the ACL 108 may be conducted away from the feature 110 by the charge dissipation layer 106. Further, unlike the ACL 108, the charge dissipation layer 106 may not have electrical charge build up on its sidewall, and thus ions traveling down into the feature 110 will not be bended sideways, reducing twisting. Accordingly, by reducing charging of the ACL 108, twisting and other distortion of the features 110 may also be reduced. This reduction in twisting distortion may be achieved without increasing the energy of ionization and thus without increasing bowing or other distortion. After the carbon etch, portions of the dielectric layer 104 within the features 110 are exposed for etching. For example, as shown in FIG. 10, after carbon etching of the device 100, the features 110 are defined through the PR layer 808, the SiARC layer 806, the ODL 804, the SiON layer 802, the ACL 108, and the charge dissipation layer 106. As another example, as shown in FIG. 18 after carbon etching of the device 200 the features 110 are defined through the PR layer 808, the SiARC layer 806, the ODL 804, the SiON layer 802, the ACL 108, the charge dissipation layer 106, and the ACL 112.

Figure 11:
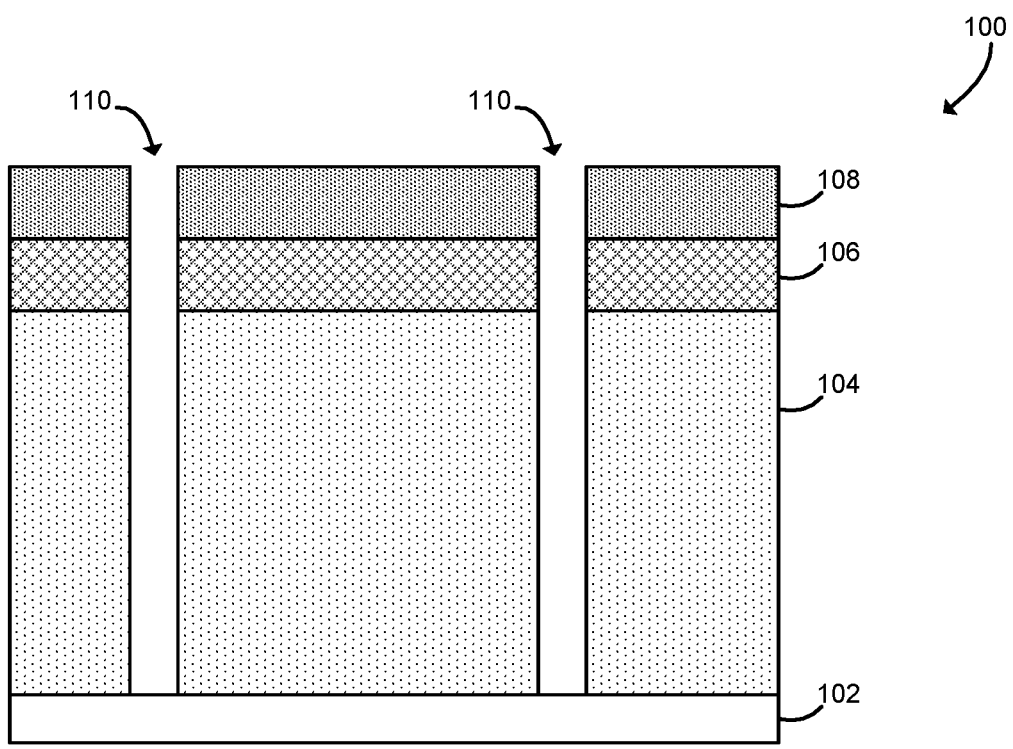
FIG. 11 is a cross-sectional, elevation view of at least one embodiment of the semiconductor device of FIG. 10 subsequent to etching the dielectric during the performance of the method of FIG. 3.
Figure 19:
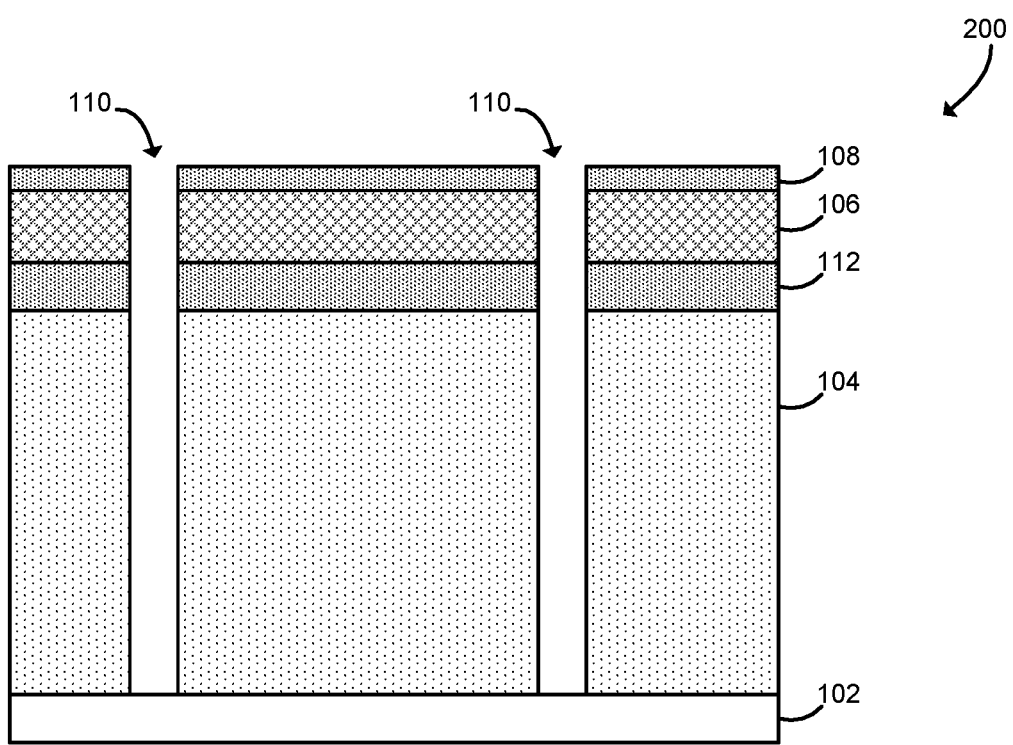
FIG. 19 is a cross-sectional, elevation view of at least one embodiment of the semiconductor device of FIG. 18 subsequent to etching the dielectric during the performance of the method of FIG. 3.

Referring back to FIG. 3, after performing the carbon etch, in block 334 a dielectric etch of the dielectric layer 104 is performed. Etching the dielectric layer 104 removes the parts of the dielectric layer 104 that are revealed within the features 110. Etching the dielectric layer 104 also includes removing the mask layer (e.g., the PR layer 808, the SiARC layer 806, the ODL 804, and the SiON layer 802) and part of the ACL hard mask layer 108. For example, FIG. 11 illustrates the device 100 after dielectric etching, and FIG. 19 illustrates the device 200 after dielectric etching. As shown, after dielectric etching the features 110 are defined through the ACL 108, the charge dissipation layer 106, the ACL 112 (if present), and the dielectric layer 104. In some embodiments, the remaining ACL 108, 122 may be removed through $O_2$ ashing, and the remaining charge dissipation layer 108 may be removed by a wet clean with proper chemistry.

After performing the dielectric etch, the method 300 is completed. After completing the high aspect ratio etching, the device 100, 200 may be subject to further processing steps to manufacture a completed semiconductor device, such as a 3D NAND memory device. Again, it should be appreciated that the blocks 302-334 described above are illustrative process steps to form the device 100, 200 and, in other embodiments, additional or different process steps may be used and/or the blocks 302-334 described above may be performed in another sequential order.

While the disclosure has been illustrated and described in detail in the drawings and foregoing description, such an illustration and description is to be considered as illustrative and not restrictive in character, it being understood that only illustrative embodiments have been shown and described and that all changes and modifications that come within the spirit of the disclosure are desired to be protected.

There are a plurality of advantages of the present disclosure arising from the various features of the methods, apparatuses, and systems described herein. It will be noted that alternative embodiments of the methods, apparatuses, and/or systems of the present disclosure may not include all of the features described yet still benefit from at least some of the advantages of such features. Those of ordinary skill in the art may readily devise their own implementations of the methods, apparatuses, and systems that incorporate one or more of the features of the present invention and fall within the spirit and scope of the present disclosure as defined by the appended claims.

The invention claimed is:

1. A semiconductor device structure comprising:
a dielectric layer formed on a silicon substrate;
an amorphous carbon layer formed on the dielectric layer; and
a charge dissipation layer formed between the amorphous carbon layer and the dielectric layer, the charge dissipation layer covering an outer sidewall and a top surface of the dielectric layer, wherein the charge dissipation layer comprises a material having a resistivity lower than a resistivity of the amorphous carbon layer, wherein a portion of the charge dissipation layer is physically contacting the silicon substrate at an edge of the semiconductor device structure.

2. The semiconductor device structure of claim 1, wherein the charge dissipation layer is formed directly on the dielectric layer.

3. The semiconductor device structure of claim 1, wherein the amorphous carbon layer comprises a second amorphous carbon layer, the semiconductor device structure further comprising:
a first amorphous carbon layer formed between the charge dissipation layer and the dielectric layer, wherein a second thickness of the second amorphous carbon layer is larger than a first thickness of the first amorphous carbon layer.

4. The semiconductor device structure of claim 1, wherein the charge dissipation layer comprises a silicon-containing material.

5. The semiconductor device structure of claim 4, wherein the silicon-containing material comprises amorphous silicon, polysilicon, monocrystalline silicon, or doped silicon.

6. The semiconductor device structure of claim 1, wherein the charge dissipation layer comprises a metallic material.

7. The semiconductor device structure of claim 6, wherein the metallic material comprises tungsten, titanium, tantalum, ruthenium, or aluminum.

8. The semiconductor device structure of claim 1, wherein:
the amorphous carbon layer has a thickness between about 2500 nanometers to about 3500 nanometers; and
the charge dissipation layer has a thickness of about 50 nanometers.

9. The semiconductor device structure of claim 1, wherein the dielectric layer is part of a three-dimensional NAND memory stack.

10. A semiconductor device structure comprising:
a silicon substrate comprising a first surface that extends to a wafer edge;
a dielectric layer formed on the first surface of the silicon substrate;
a charge dissipation layer formed on the dielectric layer, wherein the charge dissipation layer comprises a wall that surrounds the dielectric layer, wherein the wall is physically contacting the silicon substrate between the wafer edge and the dielectric layer, and wherein the charge dissipation layer has a thickness of about 50 nanometers; and
an amorphous carbon layer formed on the charge dissipation layer, wherein the amorphous carbon layer has a thickness between about 2500 nanometers and 3500 nanometers, and wherein the charge dissipation layer comprises a material having a resistivity lower than a resistivity of the amorphous carbon layer.

11. The semiconductor device structure of claim 10, wherein the amorphous carbon layer comprises a second amorphous carbon layer, the semiconductor device structure further comprising a first amorphous carbon layer formed between the charge dissipation layer and the dielectric layer, wherein the first amorphous carbon layer has a thickness that is less than the thickness of the second amorphous carbon layer.

12. The semiconductor device structure of claim 10, wherein the charge dissipation layer is formed directly on the dielectric layer.

13. The semiconductor device structure of claim 10, wherein the charge dissipation layer comprises a silicon-containing material.

14. The semiconductor device structure of claim 10, wherein the charge dissipation layer comprises a metallic material.

15. The semiconductor device structure of claim 14, wherein the metallic material comprises tungsten, titanium, tantalum, ruthenium, or aluminum.

16. The semiconductor device structure of claim 1, further comprising:
a high-aspect ratio feature disposed through the amorphous carbon layer, the charge dissipation layer, and the dielectric layer.

17. The semiconductor device structure of claim 16, wherein the high-aspect ratio feature comprises a hole having a diameter of about 70 nanometers or a slot having a width of about 150 nanometers.

18. The semiconductor device structure of claim 1, wherein the amorphous carbon layer covers an outer sidewall of the charge dissipation layer.

19. A wafer comprising:
a dielectric layer disposed on a silicon substrate, the dielectric layer comprising a top surface and an outer sidewall proximate an edge of the wafer;
a first amorphous carbon layer disposed on the dielectric layer;
a charge dissipation layer disposed between the first amorphous carbon layer and the dielectric layer, the charge dissipation layer surrounding the outer sidewall of the dielectric layer and disposed over the top surface of the dielectric layer; and
an electrical interface between the silicon substrate and a portion of the charge dissipation layer surrounding the outer sidewall, wherein the charge dissipation layer comprises a material having a resistivity lower than a resistivity of the first amorphous carbon layer.

20. The wafer of claim 19, further comprising a second amorphous carbon layer disposed between the dielectric layer and the charge dissipation layer, the second amorphous carbon layer covering the outer sidewall and the top surface of the dielectric layer, a portion of charge dissipation layer covering an outer sidewall of the second amorphous carbon layer.

* * * * *